United States Patent [19]

Cubbage

[11] Patent Number: 4,501,458
[45] Date of Patent: Feb. 26, 1985

[54] LOCKING HINGE FOR A PRINTED CIRCUIT BOARD

[75] Inventor: William R. Cubbage, Coloma, Mich.

[73] Assignee: Heath Company, St. Joseph, Mich.

[21] Appl. No.: 537,779

[22] Filed: Sep. 29, 1983

[51] Int. Cl.³ .......................................... H01R 23/68
[52] U.S. Cl. ................................. 339/17 L; 339/65
[58] Field of Search ......... 339/4, 17 R, 17 L, 17 LM, 339/17 M, 17 LC, 34, 65, 75 MP, 176 MP; 361/394, 395, 397, 399, 413, 415

[56] References Cited

U.S. PATENT DOCUMENTS 3,601,746 8/1971 Teagno ..................... 339/75 MP
4,319,305 3/1982 Meldrum ........................ 361/415

FOREIGN PATENT DOCUMENTS 300424 9/1965 Netherlands ........................... 339/4

Primary Examiner—Neil Abrams

[57] ABSTRACT

A locking hinge for a printed circuit board includes a pair of molded end pieces defining guide tracks cooperating with tabs on one edge of the printed circuit board for permitting confined pivotal movement thereof between two positions. Slots are formed in the guide tracks for engagement with the tabs by lateral movement of the board. When the tabs are engaged with the slots, the board is restricted from pivotal movement. Stops are formed in the end pieces adjacent to the slots to positively define the two positions. Ports are provided to permit entry and removal of the printed circuit board when in an intermediate position.

7 Claims, 9 Drawing Figures

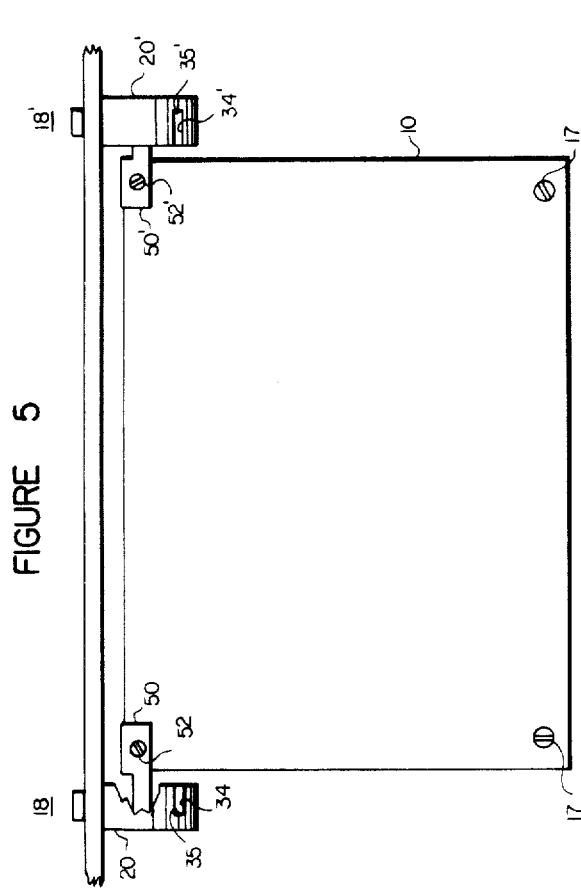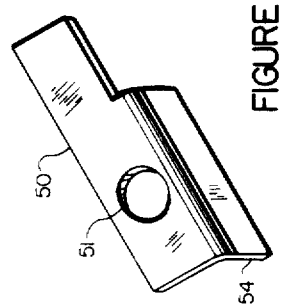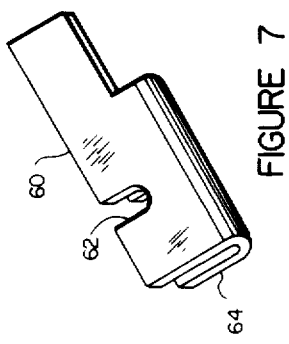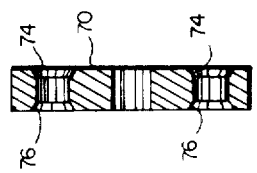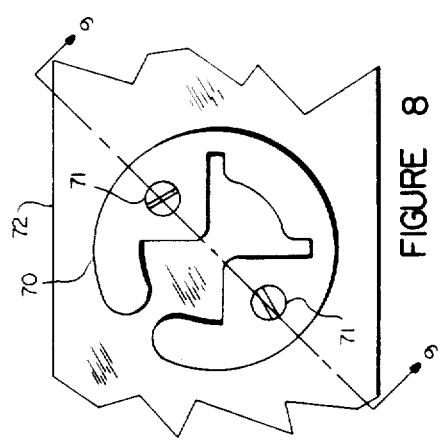

LOCKING HINGE FOR A PRINTED CIRCUIT BOARD

BACKGROUND OF THE INVENTION AND PRIOR ART

This invention relates generally to printed circuit board mounting mechanisms and specifically to a hinge arrangement for enabling a printed circuit board to be selectively positioned in two stable positions.

The use of printed circuit boards or panels for supporting electronic components and interconnections therebetween has grown dramatically over the last few years, especially in connection with the rapidly expanding use of computers. The advantages of printed circuit boards are well known. The use of edge connectors for printed circuit boards, in conjunction with flexible cable interconnects, imparts a great deal of mobility to printed circuit boards and their components which is of great value when servicing or testing is required.

Generally speaking, the operating position of the printed circuit board is not an ideal position for servicing or testing of the components on that board. It is therefore common in the art to provide means for moving the board from its operating position (generally horizontal) to a service position to provide ready access to the underside of the board and to the connections between components. It is also desirable to be able to easily remove a board and replace it should the need occur. While the art meets these needs in various ways, most involve elaborate and expensive mechanisms and there is no simple, low cost solution available.

OBJECTS OF THE INVENTION

Accordingly, the principal object of the invention is to provide a novel mounting assembly for a printed circuit board.

A further object of the invention is to provide an improved means for mounting a printed circuit board for operation or for servicing.

SUMMARY OF THE INVENTION

The foregoing objects are attained by the invention which comprises a combination of a printed circuit board, a pair of end pieces defining guide tracks and a pair of tabs affixed to one edge of the printed circuit board and engageable with the guide tracks, with the end pieces and the tabs cooperating to permit confined pivotal movement of the printed circuit board between two distinct positions. The guide tracks include slots, engageable with the tabs by a slight lateral movement of the printed circuit board, to restrict further pivotal movement of the board thereby defining stable positions therefor.

BRIEF DESCRIPTION OF THE DRAWINGS

These and other objects and advantages of the invention will be apparent by reading the following description thereof in conjunction with the drawings in which:

FIG. 5 is a plan view of a printed circuit board and hinge assembly of the invention;

FIG. 6 is an enlarged perspective view of one form of tab adapted to be affixed to the edge of a printed circuit board;

FIG. 7 is an enlarged perspective view of another form of tab;

FIG. 8 is a side view of a modified end piece adapted for side mounting; and

FIG. 9 is a sectional view of the end piece of FIG. 8 taken along line 9—9.

DESCRIPTION OF THE PREFERRED EMBODIMENT

Figure 1:
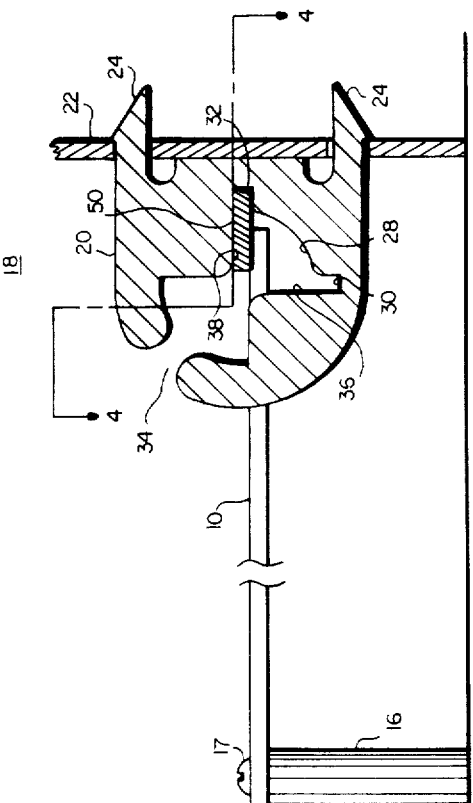
FIG. 1 is a partial sectional view of an end piece and printed circuit board constructed in accordance with the invention showing the printed circuit board in its horizontal or operating position.

Referring to the sectional view of FIG. 1, a printed circuit board 10 is supported at one edge by a support post 16, and a screw or other suitable fastener 17. The opposite edge of the board is supported by an end piece 18 having a body 20 mounted to a suitably apertured wall or bracket 22 via mounting feet 24. Body 20 may be a one-piece molded plastic element defining an internal arcuate guide track 28 having a pair of slots 30 and 32 formed therein at 90° relative to each other. The internal walls of body 20 are configured to form a pair of stops 36 and 38, radially disposed outwardly of guide track 28 and contiguous with slots 30 and 32, respectively. An entry and exit port 34 is formed opposite the center area of guide track 28 for insertion and removal of printed circuit board 10, as will be seen.

Two tabs 50 are affixed to opposite ends of one edge of printed circuit board 10 and are engageable with guide track 28 during normal confined pivotal movement of the board between the two positions defined by slots 30 and 32 and stops 36 and 38. As illustrated in FIG. 1, when circuit board 10 is in its normal horizontal operating position, tab 50 is nested in slot 32 and securely held in position by means of the support post and the wall or bracket 22. Thus the end pieces form a locking hinge arrangement for permitting controlled movement of the printed circuit board.

Figure 2:
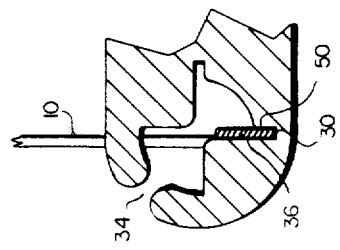
FIG. 2 is a partial view similar to that of FIG. 1 with the printed circuit board in its vertical or service position.

FIG. 2 illustrates the printed circuit board in its vertical servicing position, with tab 50 being nested in slot 30 and against stop 36. It should be readily apparent that the printed circuit board position is changed by slightly moving the board laterally to disengage the tabs from the slots that they are nested in, pivotally moving the board along the guide track 28, and again laterally moving the board to engage the tabs with the other slots. When the tabs are engaged in the slots, they prevent further pivotal movement of the board. The stops positively define the two positions of the board and the slots provide for locking the board in those positions. When the board is in the vertical servicing position, gravity assists in keeping tab 50 nested in slot 30, thus providing stability for service and testing. When in its horizontal operating position, as previously mentioned, the tabs is held in a nested relationship within slot 32 by the printed circuit board being fastened to the support post along its other edge.

Figure 3:
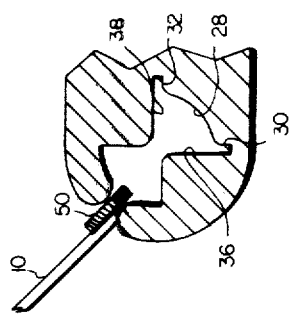
FIG. 3 is a partial view similar to that of FIG. 1 with the printed circuit board in its entry and removal position.

FIG. 3 illustrates removal (or entry) of a printed circuit board 10 from end piece 18. As should be clearly apparent from FIG. 5, only the tabs are captivated by the end pieces. Port 34 in each end piece is provided to enable the tab and the printed circuit board to which it is attached, to be removed or inserted into the end pieces.

Figure 4:
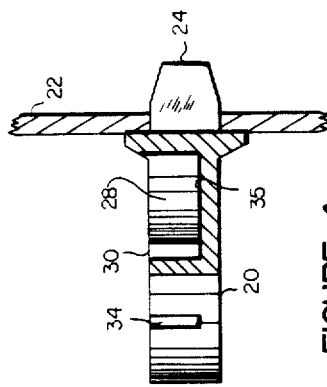
FIG. 4 is a section of the end piece of FIG. 1 taken along line 4—4.

In FIG. 4, which is a partial sectional view of end piece 18 of FIG. 1, the arrangement of mounting feet 24 and legs 28, which provide a large surface area for stable mounting of the end piece, is shown. Also the configuration of port 34 in the body is more clearly shown. In particular it will be seen that a supporting wall 35 is formed in the end piece and is engageable with the ends of tabs 50 to prevent any substantial sideward movement of the board.

FIG. 5 is a plan view of the printed circuit board mounted in a pair of end pieces 18 and 18' by means of a pair of tabs 50 and 50'. End pieces 18 and 18' are of different configuration with one being suitable for a left position and the other suitable for a right position. As will be seen, with a slightly different configuration of end piece 18, a common end piece may be used. Tabs 50 and 50' are secured at opposite ends along one edge of the printed circuit board by means of any suitable fasteners 52 and 52', screws being illustrated. The tabs may of course be fabricated of metal, plastic or any other convenient material. If appropriately strong material is used for the printed circuit board, the tabs may be formed in the board itself. The provision of separate tabs however enables their use on any size printed circuit board and therefore yields some manufacturing and assembly advantages.

In FIG. 6, tab 50 is shown in more detail with a mounting hole 51 for reception of a suitable screw fastener and an angled support portion 54. Support 54 preferably abuts the edge of the printed circuit board, thus precluding any substantial movement of the tab even though only a single fastener is used to mount the tab to the board.

In FIG. 7 a slightly different arrangement of a tab 60 is illustrated with a U-shaped folded over portion 64 being used to sandwich the board therebetween. A mounting slot 62 is provided for a suitable fastener. This construction of tab 60 lends itself to a molded plastic configuration and provides excellent support for the board.

In FIG. 8 a modified version of an end piece is shown. End piece 70 comprises essentially a section of a cylinder with a central portion defining the guide track, slots and stops as previously described. A pair of screws 71 is used to side mount end piece 70 to a panel 72. As is best seen in FIG. 9, which is a cross section through end piece 70 along line 9—9 through the mounting holes, the mounting holes may be conveniently tapered on each side, as illustrated at 74 on one side and as illustrated at 76 on the other side, to permit mounting of the end piece from either side by means of tapered flat head machine screws. This is useful where a recessed installation is needed for the screw heads. It will of course be appreciated that round head screws may be used with equal facility without the need for tapering, should sufficient clearance be provided. With this arrangement, the wall of the end piece may be conveniently eliminated since rigidity is imparted to the end piece by virtue of its being mounted with its large side surface area in intimate contact with a suitable panel 72. The advantage of this mounting arrangement is that only a single end piece is required rather than two different end pieces as in the other illustrated constructions. It should be recognized however, that provision of a suitably strong material would permit construction of end pieces not requiring supporting walls and thus such end pieces could be mounted on either the left or right side.

What has been described is a novel locking hinge arrangement for use with a printed circuit board to enable the printed circuit board to occupy an operating position and a servicing position, with stability in both positions. An intermediate position is provided whereby the board may be inserted or removed from the hinge end pieces.

It is recognized that numerous modifications and changes in the described embodiment of the invention will be apparent to those skilled in the art without departing from the true spirit and scope thereof. The invention is to be limited only as defined in the claims.

What is claimed is:

1. In combination:
    a printed circuit board;
    a pair of generally circular end pieces, each defining a concave guide track;
    a pair of tabs affixed to one edge of said printed circuit board and engaging said guide tracks;
    said end pieces and said tabs cooperating to permit confined pivotal movement of said printed circuit board between at least two distinct positions; and
    said guide tracks each including two slots selectively engageable with said tabs by lateral movement of said printed circuit board for restricting further pivotal movement of said tabs and thereby defining two stable positions for said printed circuit board.

2. The combination of claim 1 wherein said end pieces include ports in said guide track to permit entry and exit of said tabs when in a selected angular position to enable insertion and removal of said printed circuit board.

3. The combination of claim 2 wherein said two distinct positions are substantially 90 degrees apart and said selected angular position is substantially midway between said two distinct positions.

4. The combination of claim 3 wherein said guide tracks include stop portions adjacent to said slots for positively locating said two distinct positions.

5. The combination of claim 4 wherein said end pieces each comprise a one piece body of molded plastic having a large surface area for rigid mounting.

6. The combination of claim 5 further including support means for securing said printed circuit board in one of said two distinct positions.

7. A locking hinge for a printed circuit board including:
    a pair of generally circular end pieces each defining a concave guide track having slots radially disposed outwardly in horizontal and vertical positions at the ends thereof;
    a pair of tabs at one edge of the printed circuit board for engagement with said guide tracks to permit confined pivotal movement of said board between said horizontal and vertical positions;
    a pair of stops in each end piece adjacent each of said slots, respectively, for helping define said horizontal and vertical positions; and
    said tabs being engageable with said slots by lateral movement of said board to restrict further pivotal movement of said board.

* * * * *